United States Patent [19]

Spickler et al.

[11] Patent Number: 5,427,534
[45] Date of Patent: Jun. 27, 1995

[54] CONNECTOR WITH SIDE-SWIPE CONTACTS

[75] Inventors: John Spickler, Marietta; Scott Duesterhoeft, Etters, both of Pa.;

[73] Assignee: Berg Technology, Inc., Reno, Nev.

[21] Appl. No.: 152,479

[22] Filed: Nov. 15, 1993

[51] Int. Cl.⁶ .............................................. H01R 13/62
[52] U.S. Cl. ...................................... 439/64; 439/325; 439/347
[58] Field of Search ................. 439/64, 325, 327, 347

[56] References Cited

U.S. PATENT DOCUMENTS

| | | |
|---|---|---|
| 3,220,361 | 8/1965 | Schwartz . |
| 3,576,515 | 4/1971 | Frantz ................................ 439/267 |
| 4,017,770 | 4/1977 | Valfre ................................ 361/399 |
| 4,162,818 | 7/1979 | Martin ............................... 439/67 |
| 4,279,459 | 7/1981 | Sherman ........................... 39/64 X |
| 4,333,696 | 6/1982 | O'Neill et al. .................... 439/61 |
| 4,838,804 | 6/1989 | Banjo et al. ...................... 439/325 |
| 4,864,458 | 9/1989 | Demorat, Jr. et al. ........... 439/64 X |
| 5,152,697 | 10/1992 | Abe et al. ......................... 439/152 |

OTHER PUBLICATIONS

Roger C. Alford, "The PCMCIA Redefines Portability," BYTE, Dec. 1992, pp. 237–242.

Primary Examiner—Z. R. Bilinsky
Attorney, Agent, or Firm—Woodcock, Washburn, Kurtz, Mackiewicz & Norris

[57] ABSTRACT

A sliding contact for providing an electrical connection between a side contact of a PC card and a terminal accessible to a host device is disclosed. The disclosed sliding contact is disposed in a side rail of an ejection mechanism for receiving and ejecting the PC card and comprises a channel (16-5) in the side rail; a sliding member disposed in the channel and comprising a first part (16-2) and a second part (16-3) attached to the first part, the first part being electrically conductive; a first electrically conductive spring member (16-1) connected at a first end to the terminal (16-6) accessible to the host device and having at a second end a sliding contact with the first part (16-2) of the sliding member, the first spring member providing a first force for urging the sliding member toward the PC card; and a second spring member (16-4) providing a second force for urging the sliding member toward the PC card.

16 Claims, 3 Drawing Sheets

CONNECTOR WITH SIDE-SWIPE CONTACTS

FIELD OF THE INVENTION

The present invention relates generally to electrical connectors and more particularly to a connector comprising sliding contacts for contacting side contacts of a member, such as a printed circuit (PC) card.

BACKGROUND OF THE INVENTION

One preferred embodiment of the present invention provides a housing or ejection mechanism comprising sliding contacts for contacting side contacts of a plate-like memory or I/O card, which are two examples of a PC card. Such an embodiment is disclosed herein. However, it should be noted that, except as they may be expressly so limited, the claims at the end of this specification are not limited to such ejection mechanisms.

Plate-like integrated circuit cards, or PC cards, have become increasingly popular for use in notebook, laptop, and desktop computers, as well as other consumer products. Standard specifications from the Personal Computer Memory Card International Association (PCMCIA) and the Japan Electronic Industry Development Association (JEIDA) have helped to expand this relatively new industry. Other standard specifications have been developed by the Joint Electron Device Engineering Council (JEDEC). Although commonly referred to as "memory cards," these cards are by no means limited to data storage applications. For example, some cards perform various I/O functions for modem and local area network applications.

Currently, the PCMCIA/JEIDA standard cards incorporate a sixty-eight pin female connector at one end, and are available in three formats. Type I houses SRAM, PSRAM, MROM, OPTROM, and flash memory chips and only performs memory functions. Type I cards have a thickness of 3.3 mm. Type II cards perform I/O functions for modem and local area network (LAN) applications. The side edges of Type II cards are 3.3 mm thick; however, the main body of the cards is 5.0 mm thick. Type III cards are really not "cards" but rather are 1.8 inch hard disk drives having a 10.5 mm thick housing. However, these cards too are equipped with outside edges of 3.3 mm.

Given the increasing popularity of these PC cards, a need has arisen for suitable connector devices for connecting these cards to printed circuit boards in host devices, such as notebook, laptop and desktop computers. A number of connector devices have appeared in the prior art. Prior art connector devices typically comprise some sort of frame or housing into which a memory card may be inserted. A contact header with an array of pin contacts is provided at the far end of the housing to connect with a corresponding contact array disposed in the front end of the memory card. Connector devices typically employ an ejection mechanism having an ejector plate that engages with the PC card, a lever mounted on the housing and coupled at one end to the ejector plate, and a push rod coupled to the other end of the lever. To eject a card, the push rod is driven toward the contact header. Movement of the push rod toward the contact header is translated through the lever into movement of the ejector plate away from the contact header. As the ejector plate moves away from the contact header, it engages with the memory card thereby disconnecting the memory card from the array of contacts on the header and urging the memory card backward out of the connector device. Further information on the design of a housing with an ejection mechanism is disclosed in copending application Serial No. 08/131,212 filed Oct. 1, 1993, and titled "A Connector Apparatus for Memory Cards Having a One-Piece Integrated Frame," which is hereby incorporated by reference.

Another area of development involves the addition of so called side-swipe contact areas along the lateral sides of a PCMCIA-compatible PC card. The current PCMCIA standard defines a sixty-eight pin connector for use by a host system for control and data transfer to the PC card. Only one of the sixty-eight pins (pin 57) is available for signal propagation specific to the function of the card. For example, pin 57 is available to carry tip and ring signals on a modem card. Alternatively, the I/O connector may be allowed (by the PCMCIA committee) to provide a mechanism for signal propagation. However, this would require an external connection on the end of the PC card.

With the newly developed side contact on the PC card, signals may be propagated through the side of the card and routed internally to the appropriate connector on the host platform. In this manner, users of PC cards are only required to carry the PC card while still maintaining system functionality. However, such a system requires a host system header or ejection mechanism that provides side-swipe contacts. Moreover, it is required that the side-swipe contacts provide both a good electrical contact when a PC card is fully inserted in the host system header or ejection mechanism and an easy sliding fit allowing the card to be easily slid in and out of the ejection mechanism.

Prior art patents have disclosed side contact arrangements for printed circuit boards (PCBs). For example, U.S. Pat. No. 3,576,515, Apr. 27, 1971, "Printed Circuit Edge Connector," discloses a PCB edge connector for connecting a plurality of stacked PCBs having connector elements extending outwardly from the edges of the respective PCBs. As depicted in FIGS. 1 and 2 of the patent, when inserting a PCB into the connector housing, two pins are passed through apertures extending the entire length of the housing. The pins, during movement through the aperture, abut the connectors and force the connectors away from the slot through which the PCB slides. In this way, the PCB can be slid along the grooves of the connector housing for the full length thereof while the pin is inserted and is biasing the connectors in the connector housing out of the path of travel. Upon removal of the pins, the connectors in the connector housing assume their original position due to their resiliency or spring action and abut the terminals of the printed circuit to complete the electrical connection.

This arrangement is undesirable because, among other things, the requirement that pins be employed in order to insert the PCB into the respective slots of the housing makes this arrangement unacceptably difficult to use and expensive. Moreover, it is unsuitable for use in connection with an ejection mechanism for PC cards, the preferred application of the present invention.

U.S. Pat. No. 4,017,770, Apr. 12, 1977, "Connecting Device for Telecommunication Circuits," discloses a connecting device comprising a rectangular frame of insulating material having guide grooves that engage the edges of a PCB. Connectors on the frame consist of areas of conductive material disposed on the inner face of each of the two opposite sides of the frame. In the embodiment depicted in FIG. 3 of the patent, the movable PCB is provided, on the edges engaging the grooves, with contact springs which provide for the desired connection between the circuit on the PCB and the connectors on the frame when the board is inserted in the frame.

This approach is unacceptable for applications involving PC cards because it requires the cards to be modified by adding contact springs along their sides. Moreover, the use of contact springs as disclosed in the patent would not provide both a good electrical contact when a card is fully inserted in the grooves of the side rails and an easy sliding fit allowing the card to be easily slid in and out of the side rails. This is because the force of the spring varies as the spring is compressed and expanded. Therefore, a spring that, when extended, provides a suitable force to provide a good electrical connection also necessarily provides, when compressed, too much force during sliding of the PCB in the grooves of the housing.

Accordingly, a primary goal of the present invention is to provide a sliding contact arrangement, suitable for use with PC cards and the like, which allows the card to be easily slid in and out of an ejection mechanism and, furthermore, provides a good electrical connection with the side contacts of the PC card.

SUMMARY OF THE INVENTION

The present invention provides a sliding contact for providing an electrical connection between a side contact of a member (such as, e.g., a PC card) and a terminal accessible to a host device, the sliding contact being disposed in a side rail of an ejection mechanism for receiving and ejecting the PC card. According to the invention, the sliding contact comprises (a) a channel (16-5) in the side rail; (b) a sliding member disposed in the channel and comprising a first part (16-2) and a second part (16-3) attached to the first part, the first part being electrically conductive; (c) a first electrically conductive spring member (16-1) connected at a first end to the terminal (16-6) accessible to the host device and having at a second end a sliding contact with the first part (16-2) of the sliding member, the first spring member providing a first force for urging the sliding member toward the PC card; and (d) a second spring member (16-4) providing a second force for urging the sliding member toward the PC card.

In one preferred embodiment of the invention (described below), the first part of the sliding member comprises (1) a first surface characterized by a normal vector which is substantially perpendicular to the direction of sliding movement of the sliding member in the channel, and (2) a second surface inclined relative to the first surface. The first spring member is in sliding contact with the inclined surface and provides the first force urging the sliding member toward the PC card when the sliding member is partially extended outside of the channel, and the first spring member is in sliding contact with the first surface of the sliding member when the sliding member is within the channel and not in contact with the side contacts of the PC card. In addition, in the preferred embodiment, the side contact of the PC card is disposed in a slot in the PC card and the sliding member slides into the slot such that the first electrically conductive part of the sliding member makes contact with the side contact. Moreover, the second part of the sliding member is electrically non-conductive. Furthermore, the second spring member comprises a coil spring fixed at a first end to a bottom wall of the channel and at a second end makes contact with the second part of the sliding member. The first and second spring members, in preferred embodiments, cooperate to provide a substantially flat spring force versus contact travel characteristic.

The present invention also provides an ejection mechanism for receiving and ejecting PC cards having a side contact disposed in a slot in a side of the card. According to the invention, the ejection mechanism comprises a side rail comprising a channel arranged to be adjacent the slot when the PC card is fully inserted into the ejection mechanism; and a sliding member disposed in the channel. The sliding member provides an electrical connection to the side contact when the PC card is fully inserted into the ejection mechanism, the electrical connection being accessible to a host device operatively associated with the ejection mechanism. In addition, according to the invention, the ejection mechanism comprises a biasing means for biasing the sliding member out of the channel and toward the PC card with a first force as the card is being inserted and removed from the ejection mechanism, and for biasing the sliding member against the side contact with a second force when the card is fully inserted into the ejection mechanism. The second force is greater than the first force, allowing the card to be easily slid in and out of the ejection mechanism and also providing a good electrical connection with the side contacts of the PC card.

The present invention also provides a method for providing an electrical connection between a side contact in a side slot of a PC card and a terminal of a side rail of an ejection mechanism. The inventive method comprises the steps of biasing the sliding contact out of the channel and toward the PC card with a first force as the card is being inserted into the ejection mechanism; and biasing the sliding contact against the side contact with a second force when the PC card is fully inserted into the ejection mechanism, wherein the second force is greater than the first force. In preferred embodiments, the first biasing step is performed by a first spring member and the second biasing step is performed by the first spring member and a second spring member. Other features of the invention are disclosed below.

BRIEF DESCRIPTION OF THE DRAWINGS

FIG. 2A shows the sliding contact extending from the channel in the side rail in the absence of the PC card. FIG. 2B is a similar view of the side rail but with the PC card partially inserted into the side rail. FIG. 2C is a view with the PC card fully inserted into the side rail and the sliding contact making contact with the side contact in the PC card.

FIG. 4A is a view of the sliding contact extending from the channel of the side rail, and FIG. 4B is a view of the sliding contact fully inside the channel of the side rail as the PC card is being inserted.

DETAILED DESCRIPTION OF PREFERRED EMBODIMENTS

Figure 1:
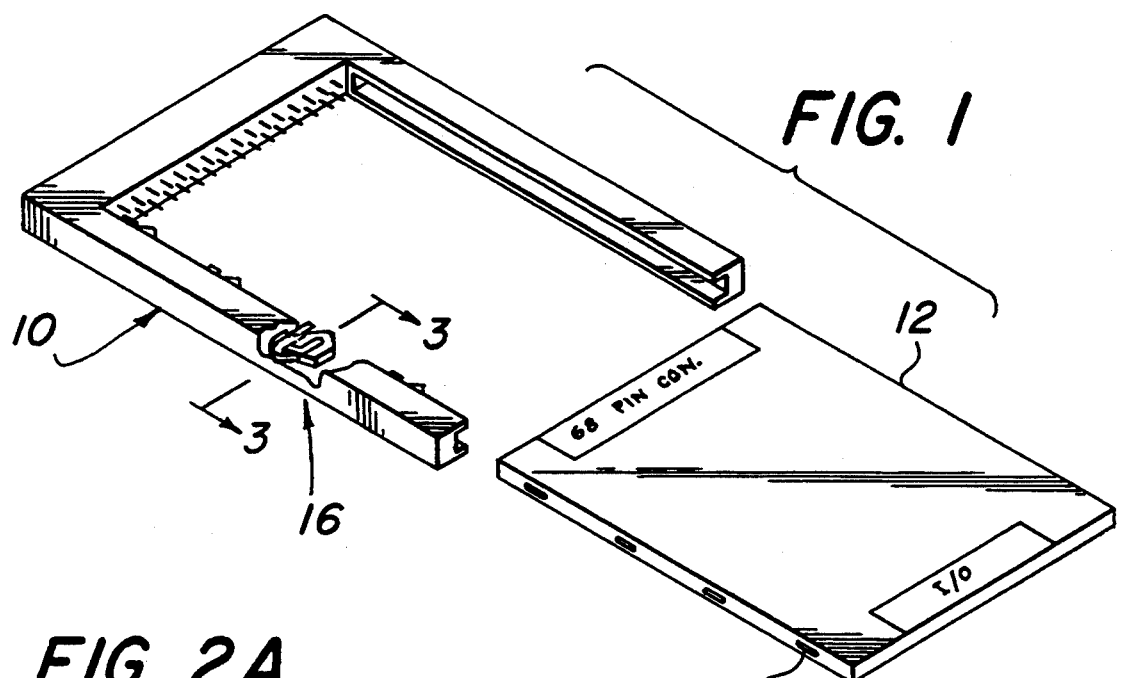
FIG. 1 is a depiction of a side rail of an ejection mechanism in accordance with the present invention and a PC card with side contacts.

FIG. 1 depicts the side rail 10 of an ejection mechanism. For further details on the ejection mechanism, the reader is referred to the U.S. Pat. No. 5,152,697. As shown, the side rail 10 includes grooves for receiving a PC card 12 having side contacts 14 disposed in respective slots on the side of the card. In addition, the side rail 10 includes a plurality of sliding contacts 16 for making contact with the respective side contacts of the PC card. As shown, the side contacts 14 of the PC card 12 are the contacts on the lateral sides of the card, i.e., the adjacent the ends of the card with the 68 pin connector and I/O connector.

Figure 2A:
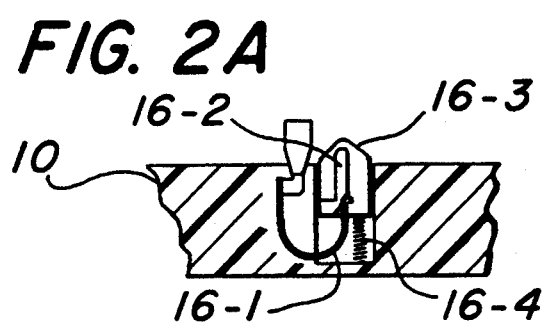
FIGS. 2A–2C are cross-sectional top views of the side rail.
Figure 2B:
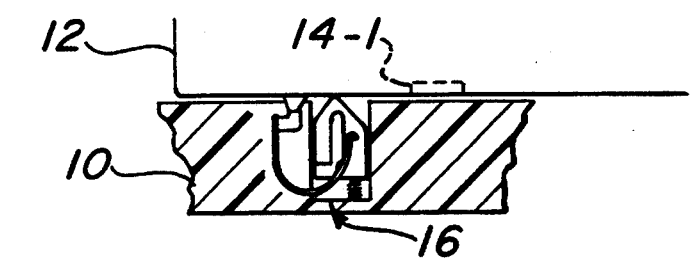
Figure 2C:
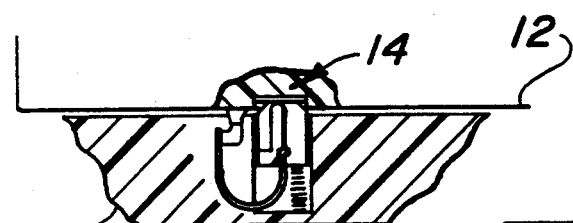

Referring now to FIGS. 2A–2C, the side contacts include a first spring member 16-1, and a sliding member comprising a first conductive part 16-2 and a second non-conductive (e.g., plastic) part 16-3, wherein the first and second parts are attached to each other and move in unison in the channel. When a PC card is partially inserted or a card without side contacts is inserted, the non-conductive member 16-3 isolates the conductive member 16-2 from the card, which may have a conductive outer surface. For example, a shielded PC card could have a conductive outer side surface that would have to be isolated from the conductive member 16-2. This isolation is provided by an air gap formed by the non-conductive member's top portion extending beyond the top of the conductive member 16-2. This is clearly shown in FIGS. 4A and 4B.

The details of the operation of the sliding contact are described below in connection with FIGS. 4A and 4B. However, briefly, the first spring 16-1 and a second spring 16-4, in combination with the sliding member, cooperate to provide a sliding side contact which allows the PC card 12 to be easily inserted into and removed from the side rail while also providing a good electrical connection between the conductive part of the sliding contact (part 16-2) and the side contact when the card is fully inserted into the side rail. That is, the first spring 16-1 urges the sliding contact out of the channel and toward the PC card and the side contact thereof only when the card is inserted and a side contact slot is adjacent the channel into which the sliding contact is disposed. Moreover, when the PC card is not inserted, i.e., when a PC card slot 14 is not adjacent a side contact, only the second spring member 16-4 is operative to urge the sliding contact 16 out of its channel.

FIG. 2B depicts the sliding contact 16 disposed fully within its channel as the PC card 12 is in the process of being inserted into or withdrawn from the side rail 10.

FIG. 2C depicts the sliding contact 16 extending from its channel and into the slot bearing the side contact 14 of the PC card 12.

Figure 3:
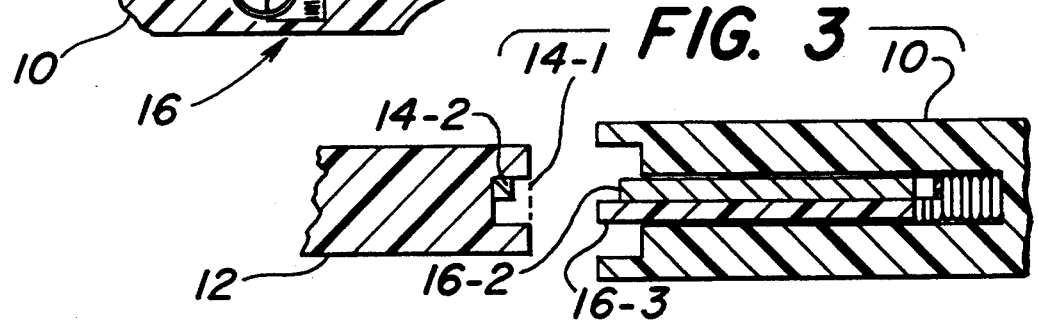
FIG. 3 is an end cutaway view of the side rail, showing how the sliding contact in the side rail makes contact with the side contact in the PC card.

FIG. 3 is an end cutaway view showing a slot 14-1 into which a side contact 14-2 is disposed inside the PC card 12. In addition, FIG. 3 depicts a first, conductive part 16-2 and a second, non-conductive part 16-3 of the sliding contact 16 disposed in a channel of the side rail 10.

Figure 4A:
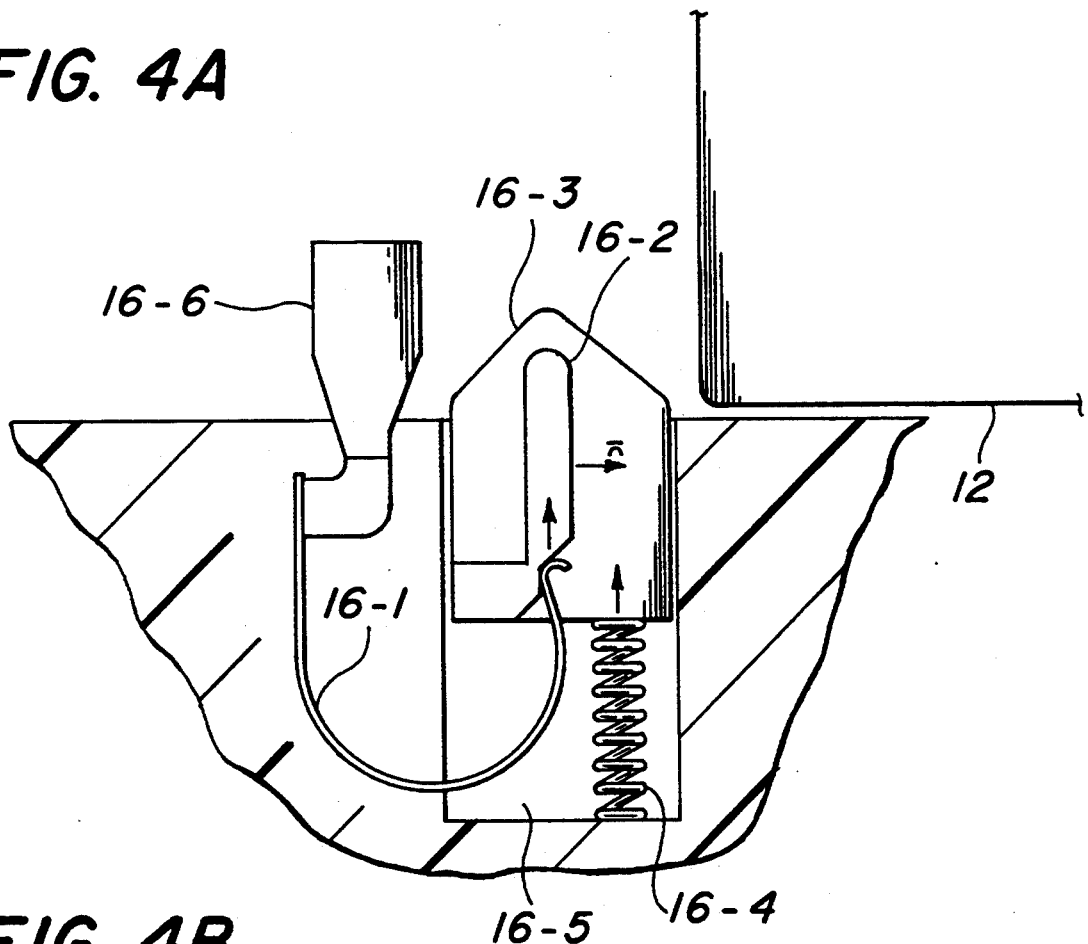
FIGS. 4A and 4B, respectively, are detailed cross-sectional views of the sliding contact arrangement of the present invention.
Figure 4B:
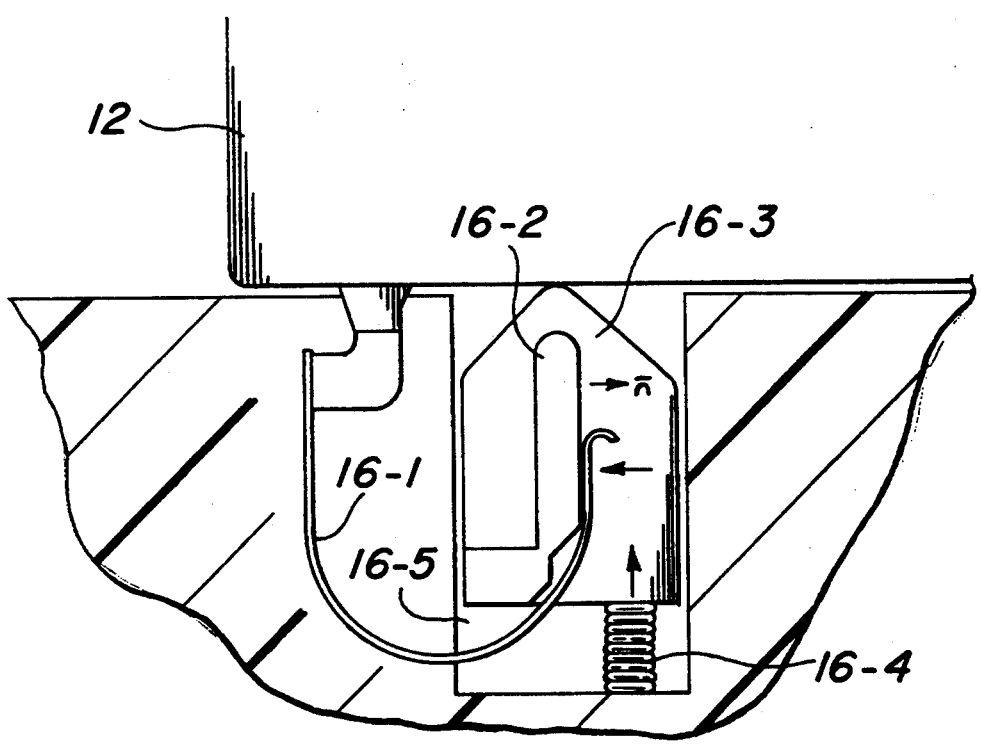

FIGS. 4A and 4B depict details of one preferred embodiment of the siding contact arrangement of the present invention. As shown, the first spring member 16-1 comprises a thin, resilient wire-like conductor in the shape of a partial loop. The conductive part 16-2 of the sliding member includes a surface characterized by a normal vector (n with an overline) which is substantially perpendicular to the movement of the sliding member inside the channel 16-5. In addition, the first conductive part 16-2 includes an inclined surface onto which the first spring 16-1 exerts an upward force to urge the sliding member out of the channel 16-5 and toward the PC card 12. As mentioned above, the second part 16-3 of the sliding member is non-conductive. In addition, the second spring 16-4 is preferably a coil spring bearing against the bottom surface of the channel 16-5 (although other types of spring will work) and disposed so as to exert an upward force on the bottom surface of the second, non-conductive part 16-3 of the sliding member. Although not shown in the drawings, the second spring is preferably retained in and extends from a bore in the side rail 10 beneath the channel 16-5. Moreover, the first spring 16-1 is electrically connected to a terminal 16-6 which is accessible to a host device associated with the ejection mechanism.

FIG. 4B depicts the sliding contact arrangement with the sliding member (16-2, 16-3) disposed fully within the channel 16-5, as it would be during insertion and removal of the PC card 12 when the slots in the side walls of the PC card are not adjacent to the channel 16-5. As shown, the first spring 16-1 slides off the inclined surface of the electrically conductive member 16-2 and thus exerts no upward force on that member. Accordingly, in this position, the only spring urging the sliding member (16-2, 16-3) upward and out of the channel 16-5 is the second spring 16-4. The springs are designed in accordance with the present invention such that the first spring in combination with the second spring provides a good electrical connection between the side contact in the PC card 12 and the electrically conductive part 16-2 when the card is inserted fully into the side rail 10. However, during insertion and removal of the PC card, only the second spring 16-4 acts to bias the sliding member out of the channel. This second spring 16-4 is sufficient to reset the first spring 16-1 onto the inclined surface of the first card 16-2, and also to allow the card to be inserted into and removed from the side rail with ease. Thus, the primary goal of the present invention is achieved by this novel arrangement of spring members in combination with the sliding member.

Figure 5:
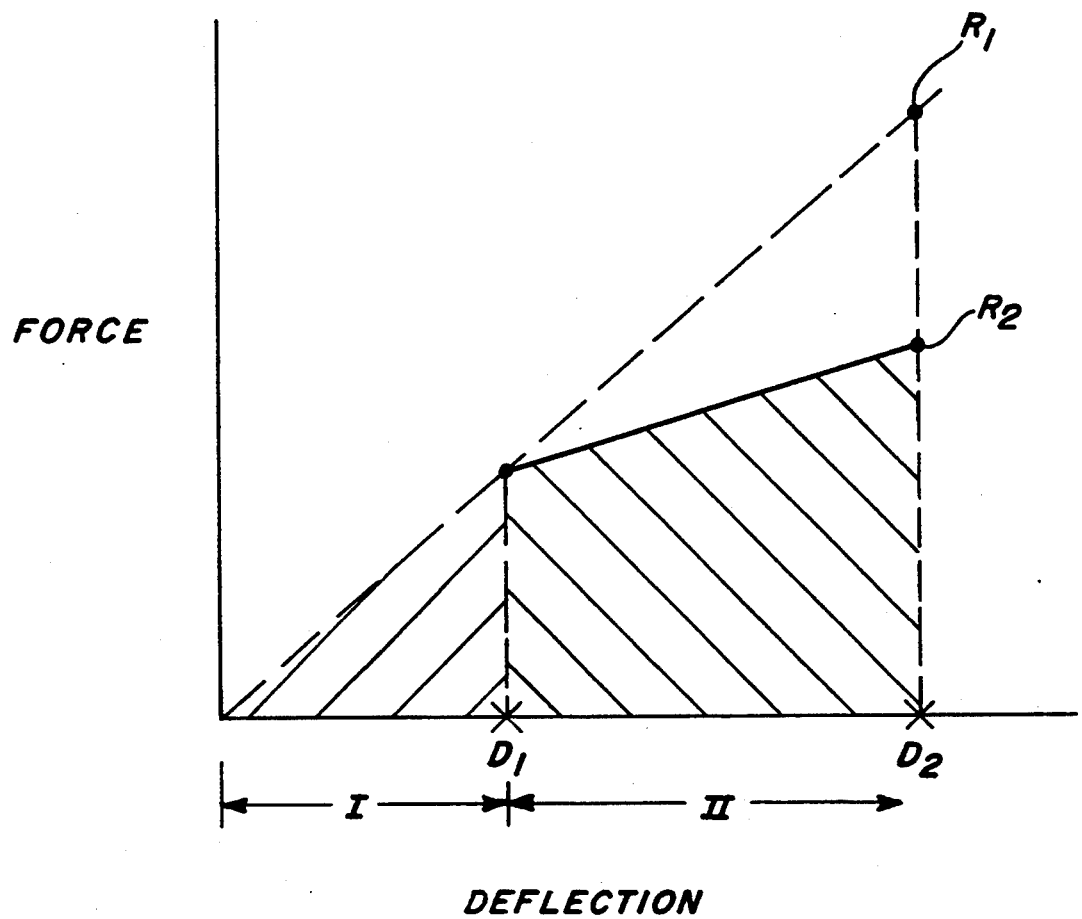
FIG. 5 is a graph of one example of a spring force vs. deflection characteristic in accordance with the present invention.

Finally, it should be noted that variations and modifications of the foregoing preferred embodiments will become apparent to those skilled in the art after reading this specification. For example, the second spring member 16-4 could be implemented like the first spring member 16-1, e.g., the first spring member could be bifurcated to provide both the first and second spring members. In this type of embodiment, the second, non-conductive part 16-3 of the sliding member would be modified so that the second spring member would continuously urge the sliding member out of the channel 16-5. FIG. 5 depicts an exemplary graph of the deflection vs. force (F) characteristic provided by the first and second spring members to urge the sliding member (16-2, 16-3) upward and out of the channel 16-5 (of course, the invention is not limited to embodiments identically providing this force vs. deflection characteristic). The point "$D_1$" represents the deflection value at which the first spring member becomes decoupled from the sliding member; the point "$D_2$" represents the full deflection point of the second spring member, i.e., with the sliding member pushed inside the channel 16-5; the point "$R_1$" represents the force/deflection point which would be achieved if the first spring member were not decoupled as described herein, and the point "$R_2$" represents the force/deflection point achieved by the present invention, with the decoupling of the first spring member As shown, in a first region "I" the first and second spring members act to urge the sliding member out of the channel. This first region corresponds to FIG. 4A. In a second region "II", corresponding to FIG. 4B, only the second spring member acts to urge the sliding member out of the channel. This type of force vs. deflection characteristic may be accomplished by modifications of the preferred embodiment described above (e.g., the bifurcated spring embodiment mentioned above). Accordingly, except where they are expressly so limited, the following claims are unlimited by the particularities of the preferred embodiments described herein.

We claim:

1. A sliding contact for providing an electrical connection between a side contact of a side contact-bearing member and a terminal accessible to a host device, said sliding contact being disposed in a side rail of an ejection mechanism for receiving and ejecting said member and comprising:
   (a) a channel in said side rail;
   (b) a sliding member disposed in said channel and comprising a first part and a second part attached to said first part, said first part being electrically conductive;
   (c) a first electrically conductive spring member connected at a first end to said terminal accessible to said host device and having at a second end a sliding contact with said first part of said sliding member, said first spring member providing a first force for urging said sliding member toward said side contact-bearing member; and
   (d) a second spring member providing a second force for urging said sliding member toward said side contact-bearing member.

2. A sliding contact as recited in claim 1, wherein said side contact-bearing member is a printed circuit (PC) card.

3. A sliding contact as recited in claim 1, wherein said first part of said sliding member comprises a first surface characterized by a normal vector which is substantially perpendicular to the direction of sliding movement of said sliding member in said channel, and a second surface inclined relative to said first surface; wherein said first spring member is in sliding contact with said inclined surface and provides said first force urging said sliding member toward said side contact-bearing member when said sliding member is near an end of its travel outside of said channel, and said first spring member is out of spring urging contact with said second surface of said member after a predetermined amount of movement into the channel.

4. A sliding contact as recited in claim 1, wherein said side contact of said side contact-bearing member is disposed in a slot in said side contact-bearing member and said sliding member slides into said slot such that said first electrically conductive part of said sliding member makes contact with said side contact.

5. A sliding contact as recited in claim 1, wherein said second part of said sliding member is electrically non-conductive.

6. A sliding contact as recited in claim 1, wherein said second spring member comprises a coil spring bearing at a first end against a bottom wall of said channel and at a second end bears against said second part of said sliding member.

7. A sliding contact as recited in claim 1, wherein said first and second spring members cooperate to provide flattened spring force versus contact travel characteristic.

8. A sliding contact as recited in claim 1, wherein:
   (1) said first part of said sliding member comprises a first surface characterized by a normal vector which is substantially perpendicular to the direction of sliding movement of said sliding member in said channel, and a second surface inclined relative to said first surface;
   (2) said first spring member is in sliding contact with said inclined surface and provides said first force urging said sliding member toward said side contact-bearing member when said sliding member is near an end of its travel outside of said channel, and said first spring member is out of spring urging contact with said second surface of said sliding member after a predetermined amount of movement into the channel;
   (3) said side contact of said side contact-bearing member is disposed in a slot in said side contact-bearing member and said sliding member slides into said slot such that said first electrically conductive part of said sliding member makes contact with said side contact; and
   (4) said second spring member comprises a coil spring bearing at a first end against a bottom wall of said channel and at a second end bears against said second part of said sliding member.

9. An ejection mechanism for receiving and ejecting printed circuit (PC) cards having a side contact disposed in a slot in a side of said card, said ejection mechanism comprising:
   (a) a side rail comprising a channel arranged to be adjacent said slot when said PC card is fully inserted into said ejection mechanism; and
   (b) a sliding member disposed in said channel, said sliding member providing an electrical connection to said side contact when said PC card is fully inserted into said ejection mechanism, said electrical connection being accessible to a host device operatively associated with said ejection mechanism; and
   (c) biasing means for biasing said sliding member out of said channel and toward said PC card with a first force as said card is being inserted and removed from said ejection mechanism, and for biasing said sliding member against said side contact with a second force when said card is fully inserted into said ejection mechanism, wherein said second force is greater than said first force.

10. An ejection mechanism as recited in claim 9, wherein said biasing means comprises first and second spring members.

11. An ejection mechanism as recited in claim 10, wherein said first spring member is electrically conductive, attached at one end to a terminal operatively connected to said host device, and in contact at a second end with said sliding member.

12. An ejection mechanism as recited in claim 11, wherein said second spring member comprises a coil spring bearing at a first end to against bottom wall of said channel and at a second end bears against said sliding member.

13. An ejection mechanism as recited in claim 12, wherein said sliding member comprises a first part and a second part attached to said first part, said first part being electrically conductive; wherein said first part of said sliding member comprises a first surface characterized by a normal vector which is substantially perpendicular to the direction of sliding movement of said sliding member in said channel, and a second surface inclined relative to said first surface; and wherein said first spring member is in sliding contact with said second surface when said sliding member is partially extended outside of said channel, and said first spring member is in sliding contact with said first surface of said sliding member when said sliding member is completely within said channel.

14. A method for providing an electrical connection between a side contact in a side slot of a side contact-bearing member and a terminal of a side rail of an ejection mechanism comprising a movable contact disposed in a channel of said side rail, the movable contact being electrically connected to said terminal, the method comprising the steps of:

(a) biasing said sliding contact out of said channel and toward said side contact-bearing member with a first force as said side contact-bearing member is being inserted into said ejection mechanism; and (b) biasing said sliding contact against said side contact with a second force when said side contact-bearing member is fully inserted into said ejection mechanism, wherein said second force is greater than said first force.

15. A method as recited in claim 14, wherein biasing step (a) is performed by a first spring member and biasing step (b) is performed by said first spring member and a second spring member.

16. A sliding contact for providing an electrical connection between a side contact of a side contact-bearing member and a terminal accessible to a host device, said sliding contact being disposed in a side portion of a connector housing for receiving said member and comprising:

(a) a sliding member disposed in said side portion and comprising a first part and a second part attached to said first part, said first part being electrically conductive;

(b) a first electrically conductive spring member connected at a first end to said terminal accessible to said host device and having at a second end a sliding contact with said first part of said sliding member, said first spring member providing a first force for urging said sliding member toward said side contact-bearing member; and (c) a second spring member providing a second force for urging said sliding member toward said contact bearing member.

* * * * *